(12) United States Patent
Hayakawa et al.

(10) Patent No.: US 7,110,284 B2
(45) Date of Patent: Sep. 19, 2006

(54) MAGNETIC NONVOLATILE MEMORY CELL AND MAGNETIC RANDOM ACCESS MEMORY USING THE SAME

(75) Inventors: Jun Hayakawa, Sendai (JP); Hideyuki Matsuoka, Nishitokyo (JP)

(73) Assignee: Hitachi, Ltd., Tokyo (JP)

( * ) Notice: Subject to any disclaimer, the term of this patent is extended or adjusted under 35 U.S.C. 154(b) by 183 days.

(21) Appl. No.: 10/931,041

(22) Filed: Sep. 1, 2004

(65) Prior Publication Data

US 2005/0117392 A1 Jun. 2, 2005

(30) Foreign Application Priority Data

Oct. 10, 2003 (JP) .............................. 2003-351788

(51) Int. Cl.
*G11C 11/00* (2006.01)
(52) U.S. Cl. ..................... 365/158; 365/171; 365/173
(58) Field of Classification Search ............... 365/158, 365/173, 171
See application file for complete search history.

(56) References Cited

U.S. PATENT DOCUMENTS 6,963,500 B1 * 11/2005 Tsang ......................... 365/171

OTHER PUBLICATIONS

T. Miyazaki, et al., "Giant magnetic tunneling effect in $Fe/Al_2O_3/Fe$ junction," Journal of Magnetism and Magnetic Material 139 (1995) L231-L234.

* cited by examiner

Primary Examiner—Richard Elms
Assistant Examiner—Pho M. Luu
(74) Attorney, Agent, or Firm—Antonelli, Terry, Stout and Kraus, LLP.

(57) ABSTRACT

A magnetic nonvolatile memory cell includes a C-MOSFET, a spin torque magnetization inversion layer and a tunneling magnetoresistive layer arranged in this order. The memory cell has the function of spin torque magnetization inversion and consumes very low power. A random access memory includes a plurality of the memory cells.

20 Claims, 7 Drawing Sheets

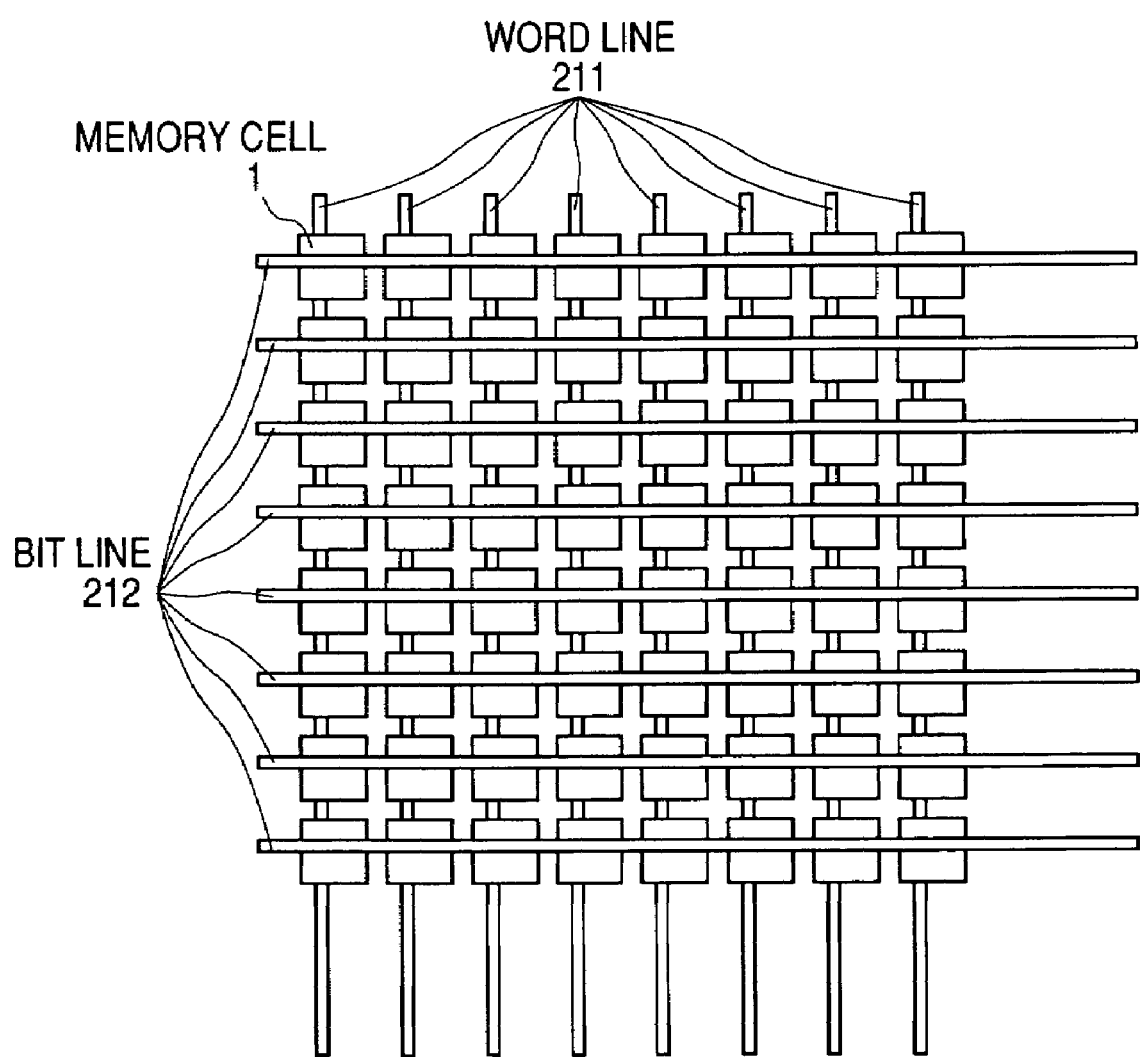

MAGNETIC NONVOLATILE MEMORY CELL AND MAGNETIC RANDOM ACCESS MEMORY USING THE SAME

FIELD OF THE INVENTION

The present invention relates to a high-power magnetic nonvolatile memory cell having the functions of switching and spin torque magnetization inversion and to a magnetic random access memory using the same.

BACKGROUND OF THE INVENTION

With reference to FIG. 6, a conventional magnetic nonvolatile memories comprise memory cells including a MOSFET and a tunneling magnetoresistive element. In such magnetic nonvolatile memories, information is written in a free layer of the tunneling magnetoresistive element using a current-induced spatial magnetic field generated by electrification between a bit line and a word line while utilizing a MOSFET for switching; and the written information is read out by the action of an output voltage (T. Miyazaki and N. Tezuka, J. Magn. Magn. Mater. 139, L231 (1995)).

In the conventional magnetic nonvolatile memories, information is written by allowing the free layer of the tunneling magnetoresistive element to inverse its magnetization using a spatial static magnetic field generated by the action of a current passing between the bit line and the word line. It therefore requires a very large power to induce a magnetic field sufficient for causing magnetization inversion, and the necessary power cannot be reduced. To solve this problem and to reduce the power consumption of a magnetic nonvolatile memory, the magnetization of the free layer should be inversed without the aid of the current-induced spatial magnetic field.

SUMMARY OF THE INVENTION

Accordingly, an object of the present invention is to solve the above problems and to provide a magnetic nonvolatile memory cell containing a C-MOSFET, a spin torque magnetization inversion layer and a tunneling magnetoresistive layer. Another object of the present invention is to provide a magnetic random access memory using the memory cell.

To achieve the above objects, the present invention provides a magnetic nonvolatile memory cell including a tunneling magnetoresistive layer containing at least a free layer, an insulative barrier layer and a pinned layer; and a bit line and a word line for writing and reading magnetization information in and from the free layer, in which a spin torque magnetization inversion layer for rotating the magnetization direction of the free layer by the action of spin torque is arranged adjacent to the tunneling magnetoresistive layer, and the tunneling magnetoresistive layer is electrically connected to a drain electrode of a MOSFET via the spin torque magnetization inversion layer, which MOSFET includes the drain electrode, a source electrode, a gate electrode, n-type semiconductors and a p-type semiconductor.

The tunneling magnetoresistive layer preferably further includes an antiferromagnetic layer for fixing the magnetization direction of the free layer by the action of exchange coupling.

It is preferred that the bit line is adjacent to the tunneling magnetoresistive layer, and the word line is adjacent to the source electrode of the MOSFET.

Preferably, the MOSFET includes an n-p-n junction in a perpendicular-to-plane direction, the gate electrode is arranged around the p-type semiconductor, the word line is adjacent to one of the n-type semiconductors arranged distant to the spin torque magnetization inversion layer, and the bit line is adjacent to the tunneling magnetoresistive layer.

The spin torque magnetization inversion layer may be a multilayer assemblage including a ferromagnetic layer and a nonmagnetic layer.

At least one of the ferromagnetic layer, the free layer and the pinned layer may be a multilayer assemblage including two or more layers.

Each of the ferromagnetic layer, the free layer and the pinned layer preferably contains at least one selected from the group consisting of Co, Fe and Ni, and the MOSFET preferably contains Si.

The present invention further provides a magnetic random access memory including bit lines, word lines and plural multilayer assemblages each being electrically connected to one of the bit lines and one of the word lines, in which the multilayer assemblages each contains a MOSFET, a spin torque magnetization inversion layer and a tunneling magnetoresistive layer being laminated, the MOSFET includes a drain electrode, a source electrode, a gate electrode, n-type semiconductors and a p-type semiconductor, the spin torque magnetization inversion layer includes a first ferromagnetic layer and a nonmagnetic layer, the tunneling magnetoresistive layer includes a second ferromagnetic layer, an insulative barrier layer and a third ferromagnetic layer, the bit line is adjacent to the tunneling magnetoresistive layer, and the word line is adjacent to the source electrode of the MOSFET.

Further objects, features and advantages of the present invention will become apparent from the following description of the preferred embodiments with reference to the attached drawings.

BRIEF DESCRIPTION OF THE DRAWINGS

FIG. 7 is a schematic diagram of a magnetic random access memory using the magnetic nonvolatile memory cell of the present invention.

DESCRIPTION OF THE PREFERRED EMBODIMENTS

Several preferred embodiments of the present invention will be illustrated in detail below with reference to FIGS. 1 to 5 and 7.

First Embodiment

Figure 1:
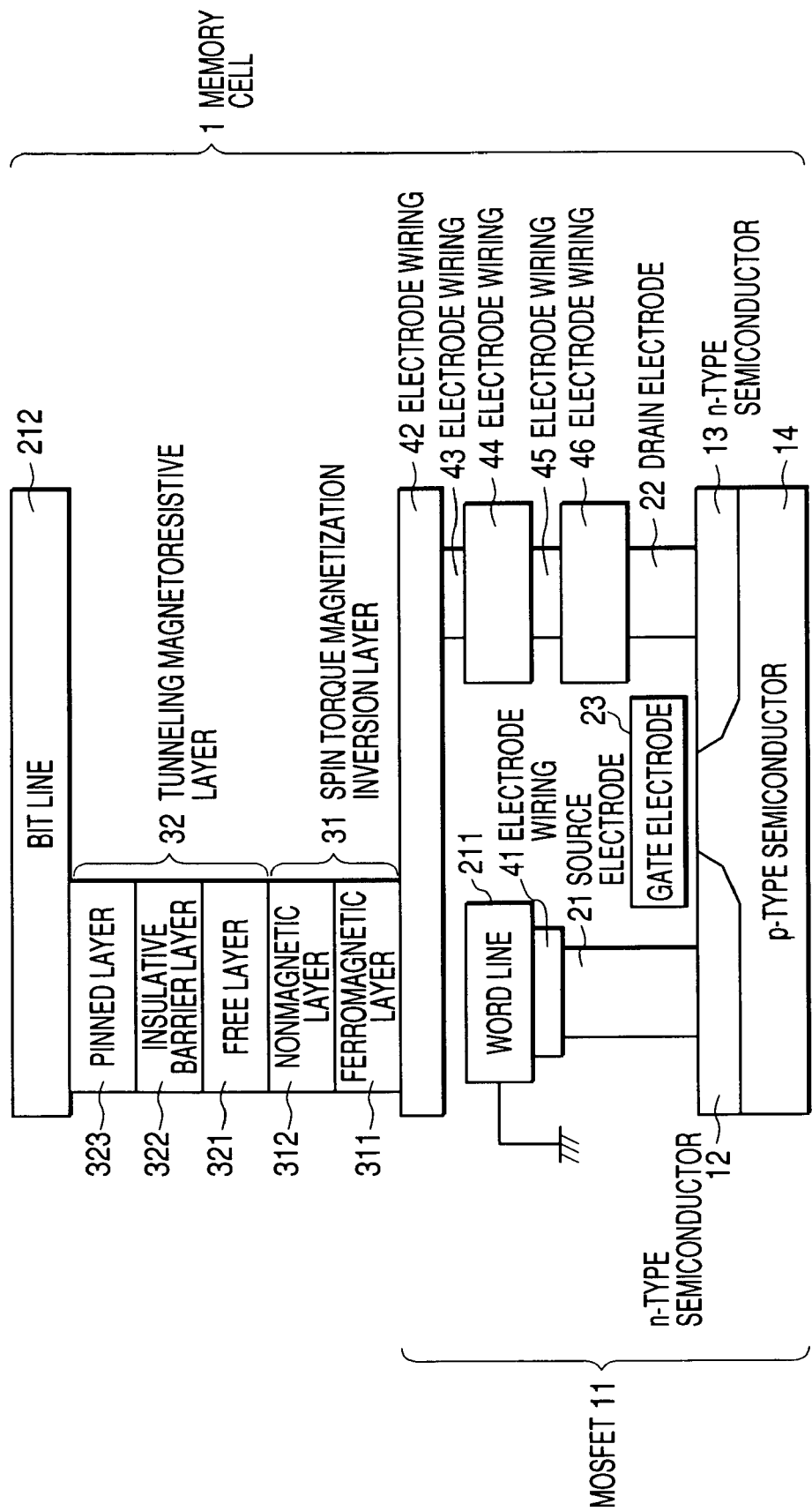
FIGS. 1, 2, 3 and 4 are schematic diagrams of first, second, third and fourth embodiments, respectively, of the magnetic nonvolatile memory cell of the present invention.

FIG. 1 is a schematic sectional view of an embodiment of the magnetic nonvolatile memory cell (hereinafter briefly referred to as "memory cell") of the present invention. A C-MOSFET 11 comprises two n-type semiconductors 12 and 13, and one p-type semiconductor 14. A source electrode 21 is electrically connected to the n-type semiconductor 12 and to a word line constituting the magnetic memory. A drain electrode 22 is electrically connected to the n-type semiconductor 13. The electric current passing between the source electrode 21 and the drain electrode 22 is switched on and off by switching on and off of a gate electrode 23. The n-type semiconductors and p-type semiconductor used herein are semiconductors containing Si.

A spin torque magnetization inversion layer 31 is arranged above the C-MOSFET 11 and is electrically connected to an electrode wiring 42. The spin torque magnetization inversion layer 31 includes a ferromagnetic layer (first ferromagnetic layer) 311 and a nonmagnetic layer 312. The ferromagnetic layer 311 herein comprises a CoFe film 3 nm thick, and the nonmagnetic layer 312 comprises a Cu film 3 nm thick. The ferromagnetic layer 311 may comprise, instead of the CoFe film, NiFe film or may be a multilayer including two or more layers made of, for example, CoFe/NiFe, and/or Ni. The nonmagnetic layer 312 may comprise, in addition to or instead of Cu, at least one of Au, Cr, Ag, Ru, Al and Pt.

A tunneling magnetoresistive layer 32 is arranged adjacent to the spin torque magnetization inversion layer 31. The tunneling magnetoresistive layer 32 comprises a free layer (second ferromagnetic layer) 321, a tunneling barrier layer (insulative barrier layer) 322 and a pinned layer (third ferromagnetic layer) 323 arranged in this order. In this embodiment, the free layer 321, the insulative barrier layer 322 and the pinned layer 323 are a CoFe film, $Al_2O_3$ (aluminum oxide) film and a CoFe film with thickness of 3 nm, 2 nm and 3 nm, respectively. Each of the free layer 321 and the pinned layer 323 may comprise NiFe instead of CoFe, or may be a multilayer containing two or more layers of, for example, CoFe and NiFe. The insulative barrier layer 322 may comprise, instead of Al oxide film, an oxide film of Hf, Ta, Mg or Ti. The pinned layer 323 may be a multilayer containing, for example, CoFe/Ru/CoFe films. A bit line 212 is arranged adjacent to and is electrically connected to the tunneling magnetoresistive layer 32.

Figure 5:
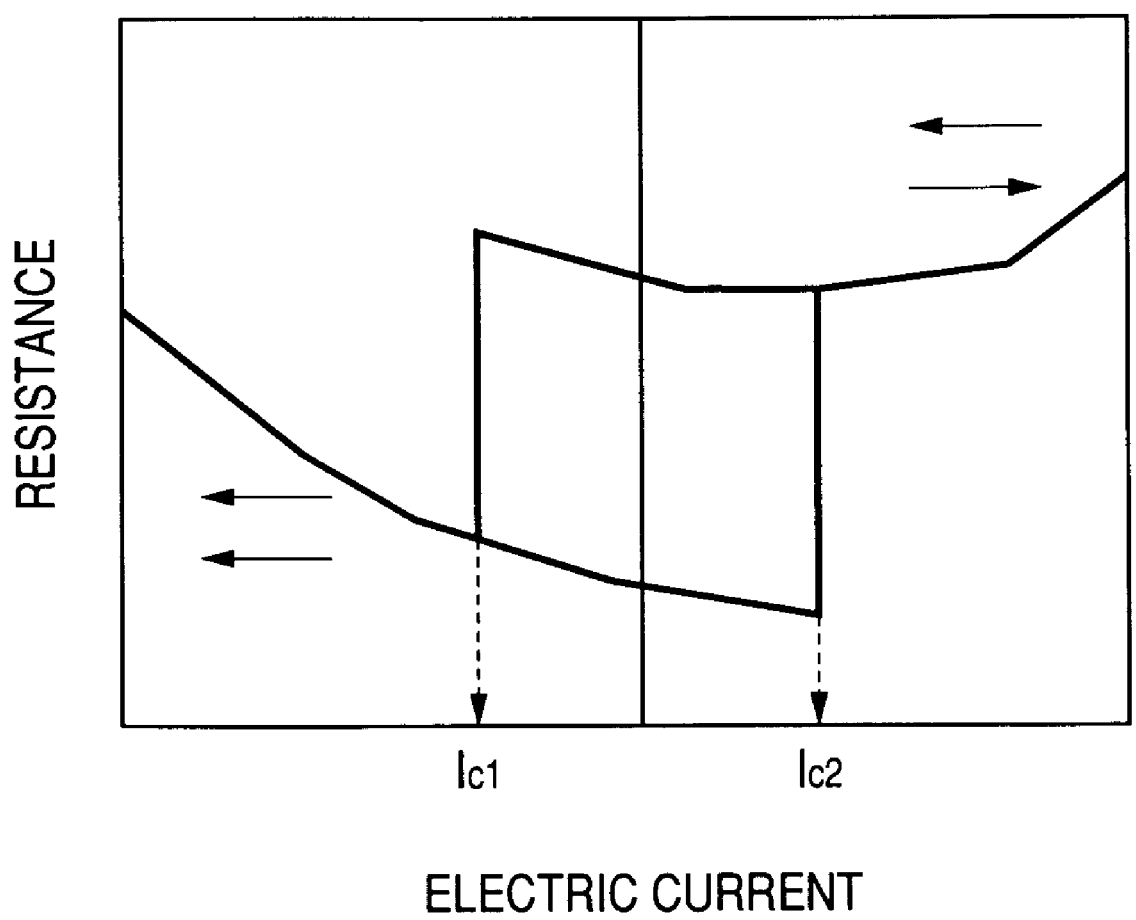
FIG. 5 shows typical resistance-electric current properties of the magnetic nonvolatile memory cell of the present invention.
Figure 6:
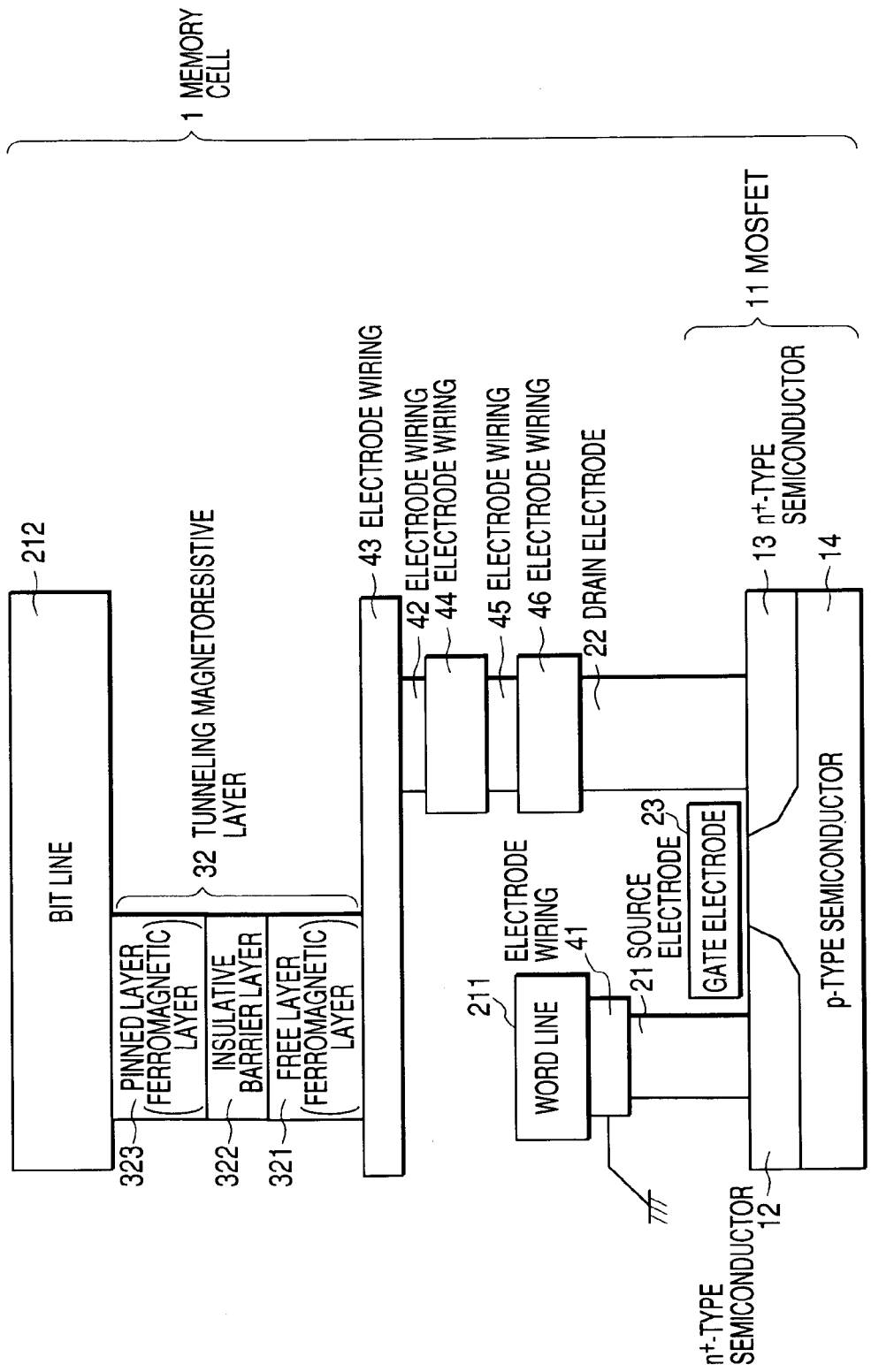
FIG. 6 is a schematic diagram of a typical configuration of a conventional magnetic nonvolatile memory cell.

FIG. 5 shows basic electric properties of the resulting memory cell 1, indicating that it shows resistance-electric current properties with hysteresis. The hysteresis is caused by the change in magnetization direction of CoFe constituting the free layer 321 due to a spin current from the spin torque magnetization inversion layer 31. At a high resistance, the magnetization direction of the free layer 321 and that of the pinned layer 322 are in antiparallel. In contrast, they are in parallel at a low resistance. To change the magnetization direction of the free layer 321, an electric current Ic1 or Ic2 shown in FIG. 5 must be allowed to flow. The required electric current in terms of current density is about $1 \times 10^7$ A/cm$^2$. The tunneling magnetoresistive layer 32 and the spin torque magnetization inversion layer 31 employed herein have a size of 50 nm square, respectively. Accordingly, the absolute electric current necessary for the magnetization inversion is about 0.25 mA, which is two or three orders of magnitude lower than that in conventional nonvolatile memories using current induction.

In this embodiment, a voltage of 200 mV is applied to the tunneling magnetoresistive layer at a read current of 20 μA. The MR ratio of the tunneling magnetoresistive element is 30% at a voltage of 200 mV, and thus the output signal stands about 600 mV.

A magnetic random access memory comprising a plurality of the magnetic nonvolatile memory cell as plural multilayer assemblages is then prepared. In the multilayer assemblages, the ferromagnetic layer of the spin torque magnetization inversion layer constitutes a first ferromagnetic layer, and the free layer and pinned layer of the tunneling magnetoresistive layer constitute second and third ferromagnetic layers, respectively. FIG. 7 schematically shows the configuration of the resulting magnetic random access memory. Each of the memory cells includes the bit line and word line shown in FIG. 7 and constitutes an electrically-connected multilayer assemblage. It is verified that the resulting magnetic random access memory can be driven at an electric current two or three orders of magnitude lower than that in conventional current-driven nonvolatile random access memories.

Second Embodiment

Figure 2:
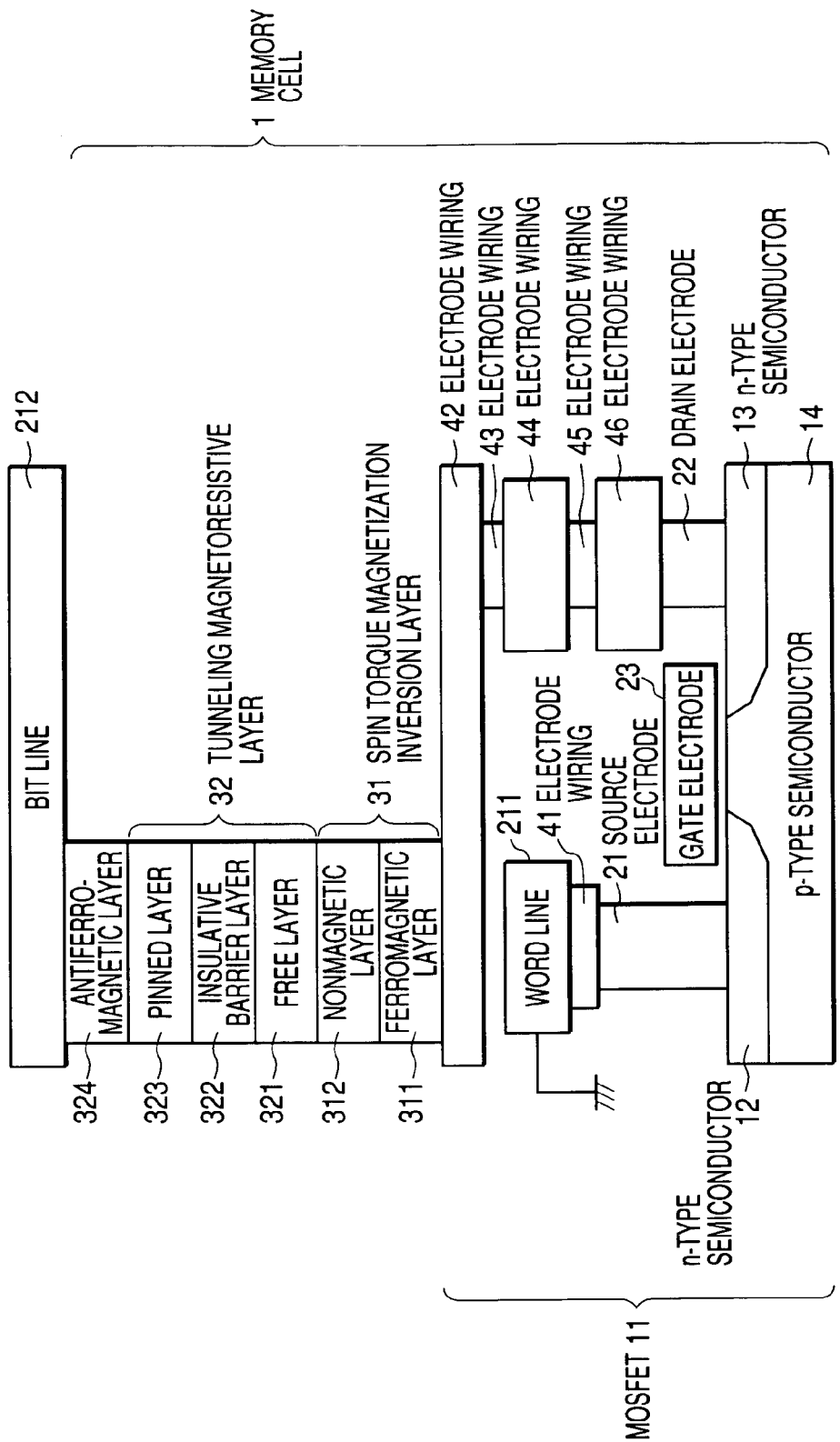

FIG. 2 is a schematic sectional view of a memory cell 1 having the configuration of FIG. 1, except for further comprising an antiferromagnetic layer 324 for fixing the magnetization direction of the pinned layer 323 in one direction. The antiferromagnetic layer 324 herein comprises a PtMn film 12 nm thick. Alternatively, an IrMn or FeMn film can be used for the antiferromagnetic layer 324. The antiferromagnetic layer 324 contributes to stabilize the antiparallel and parallel arrangement of the magnetization directions of the pinned layer 323 and the free layer 321 to thereby increase the output of the tunneling magnetoresistive layer 32. The memory cell according to Second Embodiment shows resistance-electric current properties with hysteresis as shown in FIG. 5. The tunneling magnetoresistive layer 32 in this embodiment has an output of 50%, higher than the memory cell of First Embodiment.

A magnetic random access memory comprising a plurality of the magnetic nonvolatile memory cells as plural multilayer assemblages is then prepared. In the multilayer assemblages, the ferromagnetic layer of the spin torque magnetization inversion layer constitutes a first ferromagnetic layer, and the free layer and pinned layer of the tunneling magnetoresistive layer constitute second and third ferromagnetic layers, respectively. FIG. 7 schematically shows the configuration of the resulting magnetic random access memory. Each of the memory cells includes the bit line and word line shown in FIG. 7 and constitutes an electrically-connected multilayer assemblage. It is verified that the resulting magnetic random access memory can be driven at an electric current two or three orders of magnitude lower than that in conventional current-driven nonvolatile random access memories.

Third Embodiment

Figure 3:
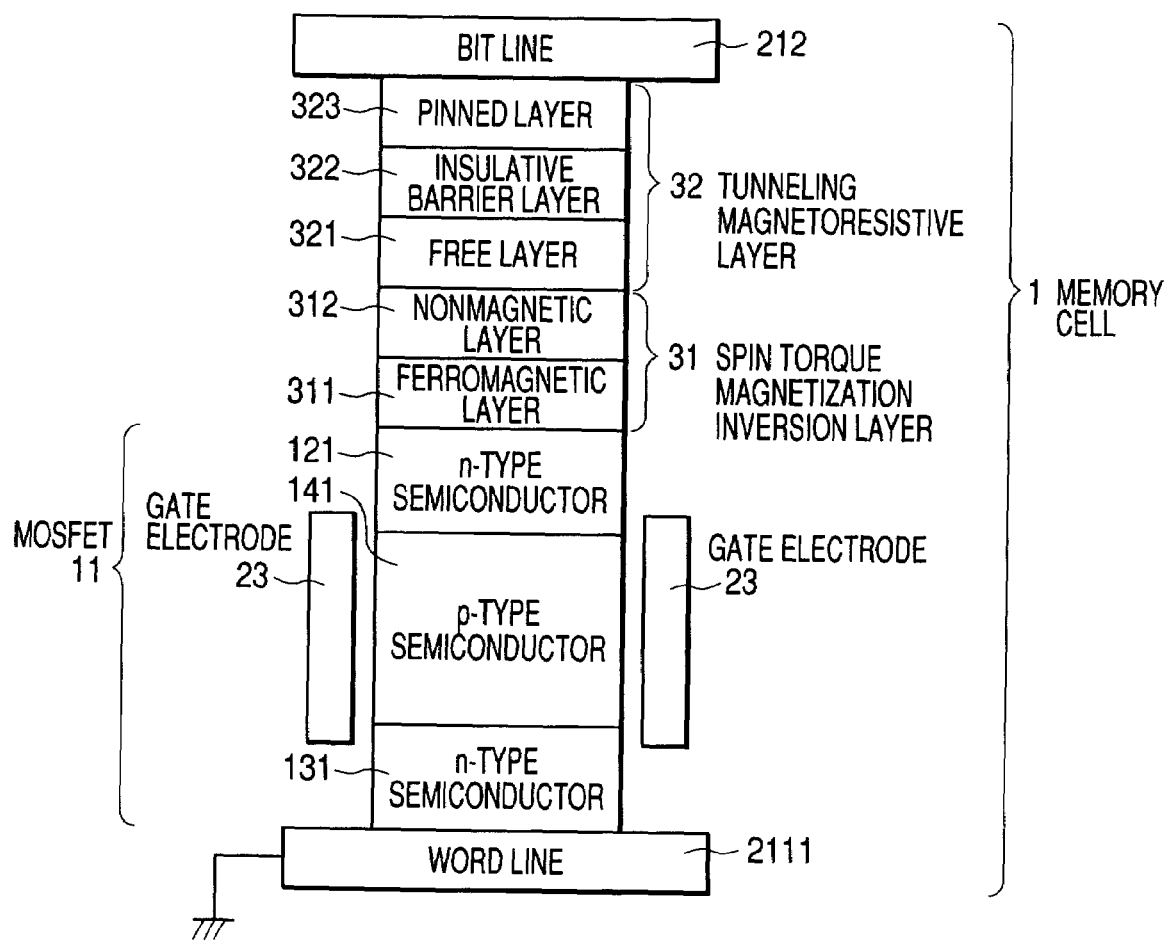

FIG. 3 is a schematic sectional view of another embodiment of a memory cell 1 according to the present invention. In this embodiment, the C-MOSFET 11 comprises a substrate, and an n-type semiconductor 131 serving as a source electrode, a p-type semiconductor 141, and an n-type semiconductor 121 serving as a drain electrode arranged in this order in a perpendicular direction to the substrate plane. The gate electrode 23 is arranged around but not in direct contact with the p-type semiconductor 141. The spin torque magnetization inversion layer 31 and the tunneling magnetoresistive layer 32 are arranged on or above the n-type semiconductor 121. Their materials, thickness and lamination order are the same as First Embodiment.

According to Third Embodiment, by perpendicularly arranging the n-type semiconductor 121 serving as the drain electrode and n-type semiconductor 131 serving as the source electrode, and arranging the gate electrode 23 on the side wall of the cell, the resulting magnetic nonvolatile memory cell has a reduced cell area and is a 4 $F^2$ memory cell. The tunneling magnetoresistive layer 32 according to this embodiment has an output of 20%.

In this embodiment, the n-type semiconductor 131 arranged distant from the spin torque magnetization inversion layer 31 is adjacent to the word line, and the tunneling magnetoresistive layer 32 is adjacent to the bit line.

A magnetic random access memory comprising a plurality of the magnetic nonvolatile memory cell as plural multilayer assemblages is then prepared. In the multilayer assemblages, the ferromagnetic layer of the spin torque magnetization inversion layer constitutes a first ferromagnetic layer, and the free layer and pinned layer of the tunneling magnetoresistive layer constitute second and third ferromagnetic layers, respectively. FIG. 7 schematically shows the configuration of the resulting magnetic random access memory. Each of the memory cells includes the bit line and word line shown in FIG. 7 and constitutes an electrically-connected multilayer assemblage. It is verified that the resulting magnetic random access memory can be driven at an electric current two or three orders of magnitude lower than that in conventional current-driven nonvolatile random access memories.

Fourth Embodiment

Figure 4:
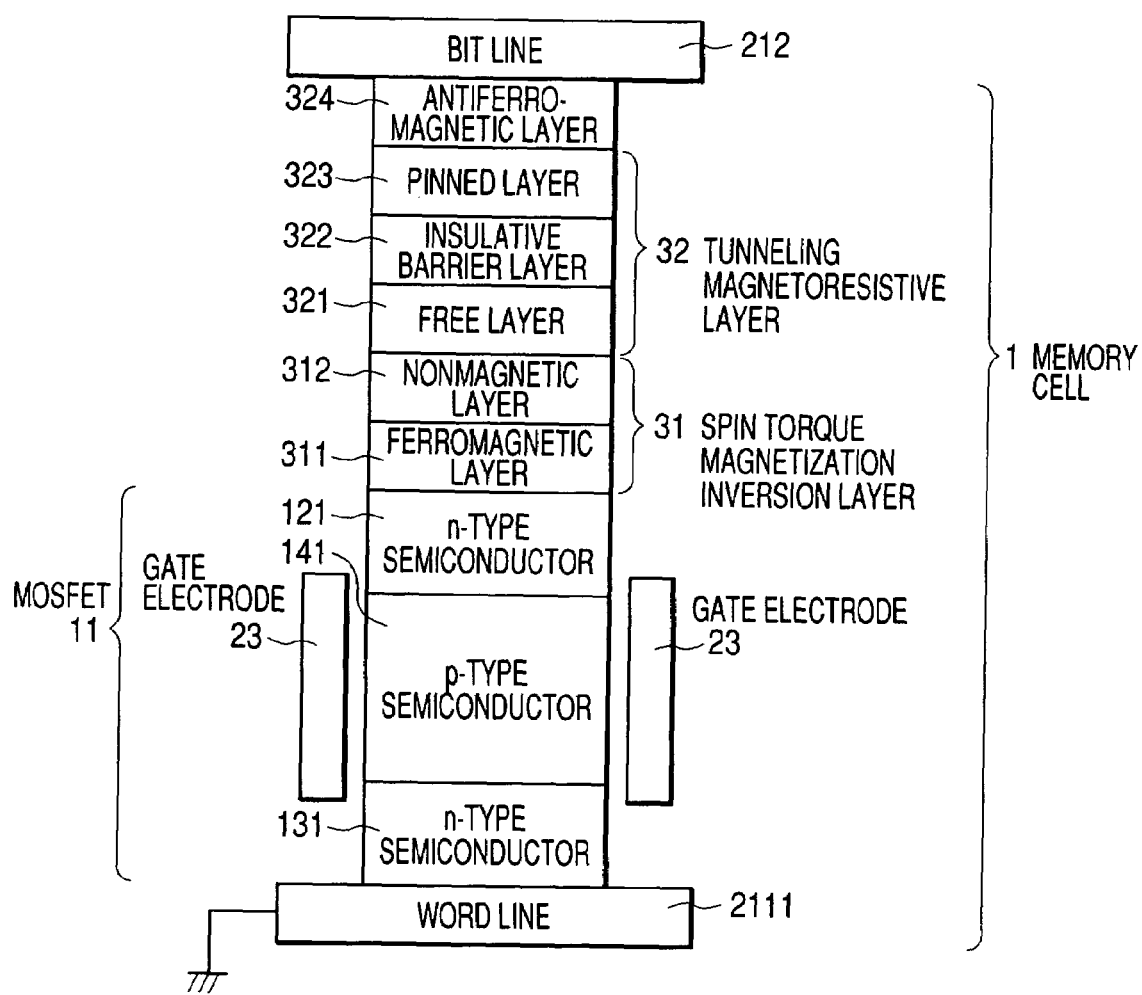

FIG. 4 is a schematic sectional view of a memory cell 1 having the configuration of FIG. 3, except for further comprising an antiferromagnetic layer 324 for fixing the magnetization direction of the pinned layer 323 in one direction. In Fourth Embodiment, the antiferromagnetic layer 324 comprises a PtMn film. Its thickness is set at 12 nm as in Second Embodiment. Instead of PtMn, IrMn or FeMn can also be employed. According to this embodiment, the antiparallel and parallel arrangement of the pinned layer 323 and the free layer 321 is further stabilized, and the output of the tunneling magnetoresistive layer 32 can be further increased.

In this embodiment, the n-type semiconductor 131 arranged distant from the spin torque magnetization inversion layer 31 is adjacent to the word line, and the tunneling magnetoresistive layer 32 is adjacent to the bit line.

In this embodiment, the resulting memory cell shows resistance-electric current properties with hysteresis as shown in FIG. 5. The tunneling magnetoresistive layer 32 has an output of 30%, higher than the memory cell according to Third Embodiment.

A magnetic random access memory comprising a plurality of the magnetic nonvolatile memory cell as plural multilayer assemblages is then prepared. In the multilayer assemblages, the ferromagnetic layer of the spin torque magnetization inversion layer constitutes a first ferromagnetic layer, and the free layer and pinned layer of the tunneling magnetoresistive layer constitute second and third ferromagnetic layers, respectively. FIG. 7 schematically shows the configuration of the resulting magnetic random access memory. Each of the memory cells includes the bit line and word line shown in FIG. 7 and constitutes an electrically-connected multilayer assemblage. It is verified that the resulting magnetic random access memory can be driven at an electric current two or three orders of magnitude lower than that in conventional current-driven nonvolatile random access memories.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A magnetic nonvolatile memory cell comprising:
    a tunneling magnetoresistive layer comprising at least a free layer, an insulative barrier layer and a pinned layer; and
    a bit line and a word line for writing and reading magnetization information in and from the free layer,
    wherein a spin torque magnetization inversion layer for rotating the magnetization direction of the free layer by the action of spin torque is arranged adjacent to the tunneling magnetoresistive layer, and
    wherein the tunneling magnetoresistive layer is electrically connected to a drain electrode of a MOSFET via the spin torque magnetization inversion layer, the MOSFET comprising the drain electrode, a source electrode, a gate electrode, n-type semiconductors and a p-type semiconductor.

2. The magnetic nonvolatile memory cell according to claim 1, wherein the tunneling magnetoresistive layer further comprises an antiferromagnetic layer for fixing the magnetization direction of the free layer by the action of exchange coupling.

3. The magnetic nonvolatile memory cell according to claim 2, wherein the bit line is adjacent to the tunneling magnetoresistive layer, and the word line is adjacent to the source electrode of the MOSFET.

4. The magnetic nonvolatile memory cell according to claim 2,
    wherein the MOSFET comprises an n-p-n junction in a perpendicular-to-plane direction,
    wherein the gate electrode is arranged around the p-type semiconductor,
    wherein the word line is adjacent to tone of the n-type semiconductors arranged distant from the spin torque magnetization inversion layer, and
    wherein the bit line is adjacent to the tunneling magnetoresistive layer.

5. The magnetic nonvolatile memory cell according to claim 2, wherein the spin torque magnetization inversion layer is a multilayer assemblage including a ferromagnetic layer and a nonmagnetic layer.

6. The magnetic nonvolatile memory cell according to claim 2, wherein at least one of the ferromagnetic layer, the free layer and the pinned layer is a multilayer assemblage including two or more layers.

7. The magnetic nonvolatile memory cell according to claim 2, wherein each of the ferromagnetic layer, the free layer and the pinned layer contains at least one selected from the group consisting of Co, Fe and Ni.

8. The magnetic nonvolatile memory cell according to claim 2, wherein the nonmagnetic layer contains at least one selected from the group consisting of Cu, Au, Cr, Ag, Ru, Al ad Pt.

9. The magnetic nonvolatile memory cell according to claim 2, wherein the MOSFET contains Si.

10. The magnetic nonvolatile memory cell according to claim 1, wherein the bit line is adjacent to the tunneling magnetoresistive layer, and the word line is adjacent to the source electrode of the MOSFET.

11. The magnetic nonvolatile memory cell according to claim 1,
    wherein the MOSFET comprises an n-p-n junction in a perpendicular-to-plane direction, wherein the gate electrode is arranged around the p-type semiconductor, wherein the word line is adjacent to one of the n-type semiconductors arranged distant from the spin torque magnetization inversion layer, and wherein the bit line is adjacent to the tunneling magnetoresistive layer.

12. The magnetic nonvolatile memory cell according to claim 1, wherein the spin torque magnetization inversion layer is a multilayer assemblage including a ferromagnetic layer and a nonmagnetic layer.

13. The magnetic nonvolatile memory cell according to claim 1, wherein at least one of the ferromagnetic layer, the free layer and the pinned layer is a multilayer assemblage including two or more layers.

14. The magnetic nonvolatile memory cell according to claim 1, wherein each of the ferromagnetic layer, the free layer and the pinned layer contains at least one selected from the group consisting of Co, Fe and Ni.

15. The magnetic nonvolatile memory cell according to claim 1, wherein the nonmagnetic layer contains at least one selected from the group consisting of Cu, Au, Cr, Ag, Ru, Al and Pt.

16. The magnetic nonvolatile memory cell according to claim 1, wherein the MOSFET contains Si.

17. A magnetic random access memory comprising bit lines, word lines and multilayer assemblage each being electrically connected to one of the bit lines and one of the word lines, wherein the multilayer assemblages each comprises a MOSFET, a spin torque magnetization inversion layer and a tunneling magnetoresistive layer, wherein the MOSFET comprises a drain electrode, a source electrode, a gate electrode, n-type semiconductors and a p-type semiconductor, wherein the spin torque magnetization inversion layer comprises a first ferromagnetic layer and a nonmagnetic layer, wherein the tunneling magnetoresistive layer comprises a second ferromagnetic layer, an insulative barrier layer and a third ferromagnetic layer, wherein the bit line is adjacent to the tunneling magnetoresistive layer, and wherein the word line is adjacent to the source electrode of the MOSFET.

18. The magnetic random access memory according to claim 17, wherein the tunneling magnetoresistive layer further comprises an antiferromagnetic layer for fixing the magnetization direction of the second ferromagnetic layer by the action of exchange coupling.

19. The magnetic random access memory according to claim 17, wherein the MOSFET comprises an n-p-n junction in a perpendicular electrode is arranged around the p-type semiconductor.

20. The magnetic random access memory according to claim 18, wherein the MOSFET comprises an n-p-n junction in a perpendicular-to-plane direction, and wherein the gate electrode is arranged around the p-type semiconductor.

* * * * *